US009714990B2

(12) United States Patent
Hong et al.

(10) Patent No.: US 9,714,990 B2
(45) Date of Patent: Jul. 25, 2017

(54) APPARATUS FOR MAGNETIC PARTICLE IMAGING

(71) Applicant: Electronics and Telecommunications Research Institute, Daejeon (KR)

(72) Inventors: Hyo Bong Hong, Daejeon (KR); Jae Ho Lim, Daejeon (KR); Jong-Hyun Park, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 374 days.

(21) Appl. No.: 14/209,837

(22) Filed: Mar. 13, 2014

(65) Prior Publication Data

US 2014/0266172 A1 Sep. 18, 2014

(30) Foreign Application Priority Data

Mar. 14, 2013 (KR) .................. 10-2013-0027481
Mar. 10, 2014 (KR) .................. 10-2014-0027860

(51) Int. Cl.
*G01R 33/10* (2006.01)
*G01R 33/02* (2006.01)

(52) U.S. Cl.
CPC ......... *G01R 33/10* (2013.01); *G01R 33/0213* (2013.01)

(58) Field of Classification Search
USPC .................. 324/300–322, 228; 600/407–435
See application file for complete search history.

(56) References Cited

U.S. PATENT DOCUMENTS

| 7,994,786 B2* | 8/2011 | Weaver ............... A61B 5/05 324/309 |
| 8,948,841 B2* | 2/2015 | Martel ............... A61B 5/055 324/307 |
| 8,954,131 B2* | 2/2015 | Weaver ............... A61B 5/05 324/300 |
| 2007/0155024 A1 | 7/2007 | Miethe et al. |
| 2009/0115415 A1* | 5/2009 | Weaver ............... A61B 5/05 324/309 |

(Continued)

FOREIGN PATENT DOCUMENTS

| KR | 10-2005-0010590 A | 1/2005 |
| KR | 10-2012-0015641 A | 2/2012 |

(Continued)

OTHER PUBLICATIONS

Bernhard Gleich et al., "Tomographic imaging using the nonlinear response of magnetic particles", Nature, Jun. 30, 2005, pp. 1214-1217, vol. 435, Nature Publishing Group.

(Continued)

*Primary Examiner* — Melissa Koval
*Assistant Examiner* — Tiffany Fetzner

(57) ABSTRACT

An apparatus for magnetic particle imaging, the apparatus comprising: a sensing unit configured to detect linear sample signals, which represent the mixed electromagnetic fields, generated from magnetic particles in a sample; a driving unit configured to move the sensing unit in a direction of X-axis, Y-axis, or Z-axis; and a data processing unit configured to rearrange in a matrix linear sample signals detected by the sensing unit that is moved by the driving unit.

14 Claims, 4 Drawing Sheets

(56) References Cited

U.S. PATENT DOCUMENTS

| | | | |
|---|---|---|---|
| 2010/0168553 A1* | 7/2010 | Martel | A61B 5/055 600/411 |
| 2011/0098558 A1* | 4/2011 | Weaver | A61B 5/05 600/420 |
| 2011/0273176 A1* | 11/2011 | Weaver | A61B 5/05 324/301 |
| 2012/0040695 A1 | 2/2012 | Won et al. | |
| 2014/0266172 A1* | 9/2014 | Hong | G01R 33/0213 324/228 |

FOREIGN PATENT DOCUMENTS

| | | |
|---|---|---|
| KR | 10-2012-0016388 A | 2/2012 |
| KR | 10-1217572 B1 | 1/2013 |
| KR | 10-1235846 B1 | 2/2013 |

OTHER PUBLICATIONS

Hans-Joachim Krause et al., "Magnetic particle detection by frequency mixing for immunoassay applications", Journal of Magnetism and Magnetic Materials, Dec. 13, 2006, pp. 436-444, vol. 311, Elsevier B.V.

Hyobong Hong et al., "Magnetic particle imaging with a planar frequency mixing magnetic detection scanner", Review of Scientific Instruments, Jan. 21, 2014, pp. 1-5, vol. 85, No. 013705, AIP Publishing LLC.

* cited by examiner

APPARATUS FOR MAGNETIC PARTICLE IMAGING

RELATED APPLICATIONS

This application claims the benefit of Korean Patent Application No. 10-2013-0027481, filed on Mar. 14, 2013, and Korean Patent Application No. 10-2014-0027860, filed on Mar. 10, 2014, which are hereby incorporated by reference as if fully set forth herein.

FIELD OF THE INVENTION

The present invention relates to magnetic particle imaging, and, more particular, to an apparatus for magnetic particle imaging capable of acquiring a two-dimensional (2-D) or three-dimensional (3-D) magnetic particle image.

BACKGROUND OF THE INVENTION

In the whole industry of medicine, biology, chemistry, and physics, 2-D or 3-D imaging of a sample to be measured is a very important. In particular, a non-destructive or non-invasive inspection method that disassembles the sample is one of the important technologies that have been pursued in modern science. The development of these technologies has contributed to the scientific area as well the whole industry in many ways. For example, X-ray, MRI (Magnetic Resonance Imaging), PET (Positron Emission Tomography), CT (Computed Tomography), and the like simply not only get information about the living body of the patients, but also enable us to gain deeper insight into the nature and science.

However, equipment for X-ray, MRI, PET, and the like has a technical limitation in providing a substantially clear image necessary for each application area. Thus, drugs often called an image tracer have generally used to overcome the technical limitation. In recent years, in order to solve demerits in terms of price and toxicity of the image tracer, NMPs (Nano Magnetic Particles) having a super-paramagnetic characteristic has been mainly used in lieu of the image tracer.

By the way, the development of a device capable of measuring the three-dimensional distribution of the NMPs is a prerequisite for the use of the NMP. However, existing devices has a constraint that requires the use of a large amount of liquid helium. Moreover, existing devices have a problem such as reliability to SQUID (Superconducting Quantum Interference Device).

SUMMARY OF THE INVENTION

In view of the above, the present invention provides an apparatus for magnetic particle imaging that is capable of measuring a 2-D or 3-D distribution image of magnetically nonlinear particles of paramagnetic material from nonlinear magnetic signals generated by the paramagnetic particles through the use of mixed electromagnetic fields.

In accordance with an embodiment of the present invention, there is provided an apparatus for magnetic particle imaging, which includes: a sensing unit configured to detect linear sample signals, which represent the mixed electromagnetic fields, generated from magnetic particles in a sample; a driving unit configured to move the sensing unit in a direction of X-axis, Y-axis, or Z-axis; and a data processing unit configured to rearrange in a matrix linear sample signals detected by the sensing unit that is moved by the driving unit.

In the embodiment, the apparatus comprising an imaging unit configured to convert the processed signals by the data processing unit into a 3-D magnetic particle image.

In the embodiment, the sensing unit: low frequency coils connected to a low frequency AC power source and configured to pass a low frequency signal through them, the low frequency coils being disposed in opposite sides with the sample between them; high frequency coils connected to a high frequency AC power source and configured to pass a high frequency signal through them, the high frequency coils being disposed in opposite sides with the sample between them; and detection coils surrounded by the low and high frequency coils to detect the sample signals that represent mixed frequency components generated from both the high and low frequency electromagnetic fields incident on the magnetic particles in the sample 10.

In the embodiment, the low frequency coils comprises: a first low frequency coil placed at the upper part of the sensing unit; and a second low frequency coil placed at the lower part of the sensing unit with the sample between the first and the second low frequency coils.

In the embodiment, the high frequency coils comprises: a first high frequency coil placed at the upper part of the sensing unit; and a second high frequency coil placed at the lower part of the sensing unit with the sample between the first and the second high frequency coils.

In the embodiment, the detection coils comprises: a first detection coil placed at the upper part of the sensing unit; and a second detection coil placed at the lower part of the sensing unit with the sample between the first and the second detection coils.

In the embodiment, the detection coils are connected to the data processing unit.

In the embodiment, the driving unit comprises an XYZ stage.

In the embodiment, the driving unit is operated in a way of moving the XYZ stage in an alternate X direction and Y direction while moving in a zigzag along the X-axis direction, and wherein the data processing unit is configured to detect X-axis data and Y-axis data during the movement of the driving unit.

In the embodiment, the data processing unit is further configured to detect Z-axis data by measuring the change of the electromagnetic fields between the first detection coil and the second detection coils.

In the embodiment, the data processing unit is configured to amplify and re-arrange the linear sample signals that are obtained linearly.

In the embodiment, the magnetic particles comprises nanomagnetic particles.

In the embodiment, the nanomagnetic particles comprise a paramagnetic material or a super-paramagnetic material.

In the embodiment, the nanomagnetic particles have a particle size of about 30 nm to 150 nm.

In the embodiment, an undiluted solution of the nanomagnetic particles may have a concentration of about 25 mg/ml.

Accordingly, it is possible to measure the 2-D or 3-D distribution image of the magnetic particles from the nonlinear magnetic signals generated by the magnetically nonlinear particles using the mixed electromagnetic fields, thereby readily acquiring a stereoscopic image for the magnetically nonlinear particles that is difficult to obtain.

BRIEF DESCRIPTION OF THE DRAWINGS

The above and other objects and features of the present invention will become apparent from the following description of the embodiments given in conjunction with the accompanying drawings, in which.

DETAILED DESCRIPTION OF THE EMBODIMENTS

Figure 1:
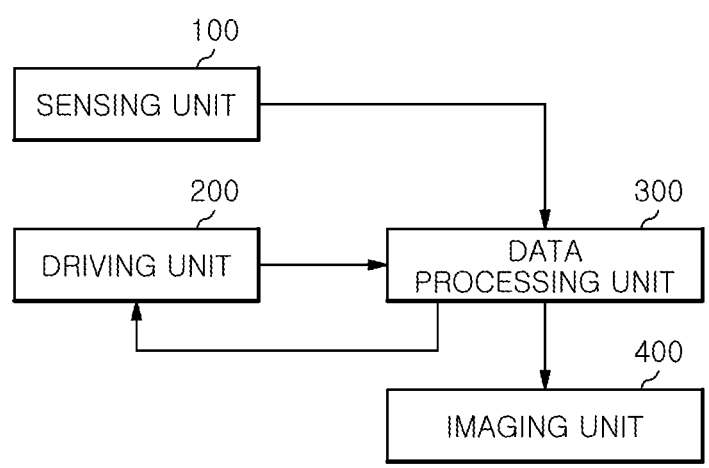
FIG. 1 illustrates a block diagram of an apparatus for magnetic particle imaging in accordance with an embodiment of the present invention.

The advantages and features of exemplary embodiments of the present invention and methods of accomplishing them will be clearly understood from the following description of the embodiments taken in conjunction with the accompanying drawings. However, the present invention is not limited to those embodiments and may be implemented in various forms. It should be noted that the embodiments are provided to make a full disclosure and also to allow those skilled in the art to know the full scope of the present invention. Therefore, the present invention will be defined only by the scope of the appended claims. Like reference numerals refer to the same or similar elements throughout the description.

In the following description, well-known functions or constitutions will not be described in detail if they would unnecessarily obscure the embodiments of the invention. Further, the terminologies to be described below are defined in consideration of functions in the invention and may vary depending on a user's or operator's intention or practice. Accordingly, the definition may be made on a basis of the content throughout the specification.

Before describing the embodiment of the present invention, the embodiment of the present invention pertains to a technology for magnetic particle imaging (MPI) that inspects the distribution of magnetically nonlinear particles used as an image tracer. The embodiment is intended to get accurate information about the distribution of the magnetically nonlinear particles used as the image tracer for an image measurement based on the technology.

To achieve it, the embodiment of the present invention detects linear signals from a material having paramagnetic or super-paramagnetic characteristic through the use of mixed electromagnetic fields and reconstructs the detected linear signals as 2-D or 3-D images by re-arranging them. Based on the foregoing process, a sample of nanomagnetic particles under developing as the image tracer is analyzed to recognize 3-D distribution of the particles. From such a technical idea described above, what the object of the present invention will be readily achieved.

Hereinafter, the embodiment of the present invention will be described with reference to the drawings.

FIG. 1 illustrates a block diagram of an apparatus for magnetic particle imaging in accordance with an embodiment of the present invention. The apparatus for magnetic particle imaging may include a sensing unit 100, a driving unit 200, a data processing unit 300, and an imaging unit 400.

As illustrated in FIG. 1, the sensing unit 100 may inspect a sample to be measured using mixed electromagnetic fields originated from two different frequency sources. The sample may contain magnetic particles of a paramagnetic material or a super-paramagnetic material that generates nonlinear signals and may be placed in between the sensing unit 100. The sample and the sensing unit 100 will be discussed in detail with reference to FIG. 2 later.

The driving unit 200 may include an XYZ stage and drive the sample or the sensing unit 100 mounted on the stage. The XYZ stage may be used to drive the sample or the sensing unit 100 automatically or manually so as for the sensing unit 100 to acquire linear sample signals by interacting with the magnetic particles contained in the sample. For example, as the XYZ stage drives the sample or the sensing unit 100 in a direction of X-axis, Y-axis, and Z-axis based on predetermined driving velocities, the sensing unit 100 may detect a linear sample signal that represents the effect of the electromagnetic fields influenced by the magnetic particles, thereby helping obtain the distribution image. The XYZ stage will be further discussed in detail with reference to FIG. 3 later.

The data processing unit 300 may re-arrange the linear sample signals that are obtained by the sensing unit 100 in a form of X-Y matrix. Specifically, the data processing unit 300 may amplify the linear sample signals before re-arranging them.

The imaging unit 400 may acquire the 3-D distribution image of the magnetic particles in the sample based on the processed linear sample signals from the data processing unit 300. The 3-D distribution image may include a stereoscopic image in a type of a contour plot.

The imaging unit 400 may be connected to a separate display device (not shown) that displays the 3-D distribution image of the magnetic particles derived from the sample containing the paramagnetic material or super-paramagnetic material.

Figure 2:
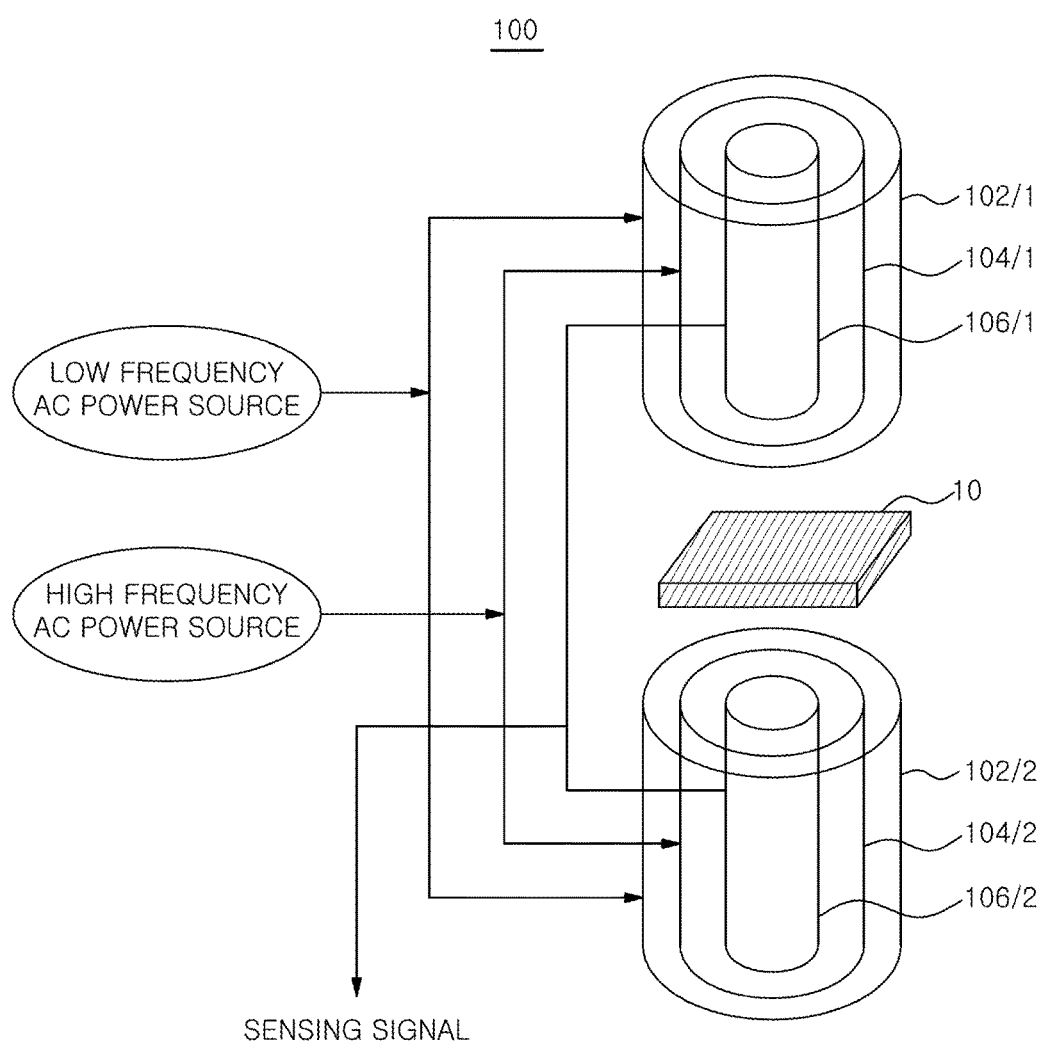
FIG. 2 shows a configuration diagram of the sensing unit shown in FIG. 1.

FIG. 2 shows a configuration diagram of the sensing unit 100 shown in FIG. 1, which scans a sample 10 containing the magnetic particles of the paramagnetic material or super-paramagnetic material by using the mixed electromagnetic fields that are originated from two different frequency sources.

Referring to FIG. 2, the sensing unit 100 may include two sets of measurement heads that include first and second low frequency coils 102/1 and 102/2, first and second high frequency coils 104/1 and 104/2, and first and second detection coils 106/1 and 106/2.

Each of the first low frequency coil 102/1 and the second low frequency coil 102/2 in each head set may be commonly connected to a low frequency AC power source 110 and allows low frequency signals to pass through it, thereby generating an electromagnetic field. The first low frequency coil 102/1 may be disposed to oppose the second low frequency coil 102/2 with the sample 10 between them. For example, the first low frequency coil 102/1 may be placed at an upper part of the sensing unit 100 and the second low frequency coil 102/2 may be placed at a lower part of the sensing unit 100, or vice versa. Alternatively, the first low frequency coil 102/1 may be placed at the left of the sample 10 and the second low frequency coil 102/2 may be placed at the right of the sample 10, or vice versa.

Similarly, each of the first high frequency coil 104/1 and the second high frequency coil 104/2 in each head set may be commonly connected to a high frequency AC power source 120 and allow high frequency signals to pass through it, thereby generating an electromagnetic field. The first high frequency coil 104/1 may be disposed to oppose the second high frequency coil 104/2 with the sample 10 between them. For example, the first high frequency coil 104/1 may be placed at an upper part of the sensing unit 100 and the second high frequency coil 104/2 may be placed at a lower part of the sensing unit 100, or vice versa. Alternatively, the first high frequency coil 104/1 may be placed at the left of the sample 10 and the high frequency coil 104/2 may be placed at the right of the sample 10, or vice versa. The first and second high frequency coils 104/1 and 104/2 may be surrounded by the first and second low frequency coils 102/1 and 102/2, respectively.

The first detection coils 106/1 may detect the linear sample signal that represents the effect of the electromagnetic fields influenced by the magnetic particles in the sample 10 when the sample 10 is exposed to the electromagnetic field components generated by respectively passing the low and high frequency signals through the first low and high frequency coils 102/1 and 104/1. Also, the second detection coil 106/2 may detect the linear sample signal that represents the effect of the electromagnetic fields influenced by the magnetic particles in the sample 10 when the sample 10 is exposed to the electromagnetic field components generated by respectively passing the low and high frequency signals through the second low and high frequency coils 102/2 and 104/2. The detections by the first and second detection coils 106/1 and 106/2 may be conducted at an every interval of the driving of the driving unit 200. As similar to the above, the first detection coil 106/1 may be placed at an upper part of the sensing unit 100, and the second detection coil 106/2 may be placed at a lower part of the sensing unit 100, or vice versa. Alternatively, the first detection coil 106/1 may be placed at the left of the sample 10, and the second detection coil 106/2 may be placed at the right of the sample 10, or vice versa. Moreover, the first and second detection coils 106/1 and 106/2 may be surrounded by the first and second high frequency coils 104/1 and 104/2, respectively. With the aforementioned configuration, the sensing unit 100 may detect the distribution of the magnetic particles contained in the sample 10 through the mixed electromagnetic fields that are derived from least two different frequencies.

The sample 10 may contain nanomagnetic particles of a paramagnetic material or a super-paramagnetic material, which is available from Chemicell, Germany. A nanomagnetic particle has a particle size, for example, in a range of about 30 nm to 150 nm, and an undiluted solution of the nanomagnetic particles may have a concentration of about 25 mg/ml.

The sample 10 may be prepared as follows:

First, the undiluted solution was diluted to 1/10 to make a total volume of the sample to be 1.0 ml.

Next, a clean room wiper, e.g., CF-990, which is available from Semitech Co., Korea, is prepared by cutting it in a size of about 2.0 mm width and about 18.0 mm length. The room wiper was immerged into the diluted solution of the nanomagnetic particles for a fixed time period (e.g., 10 second or less) and then dried in the air, thereby obtaining the sample 10.

Figure 3:
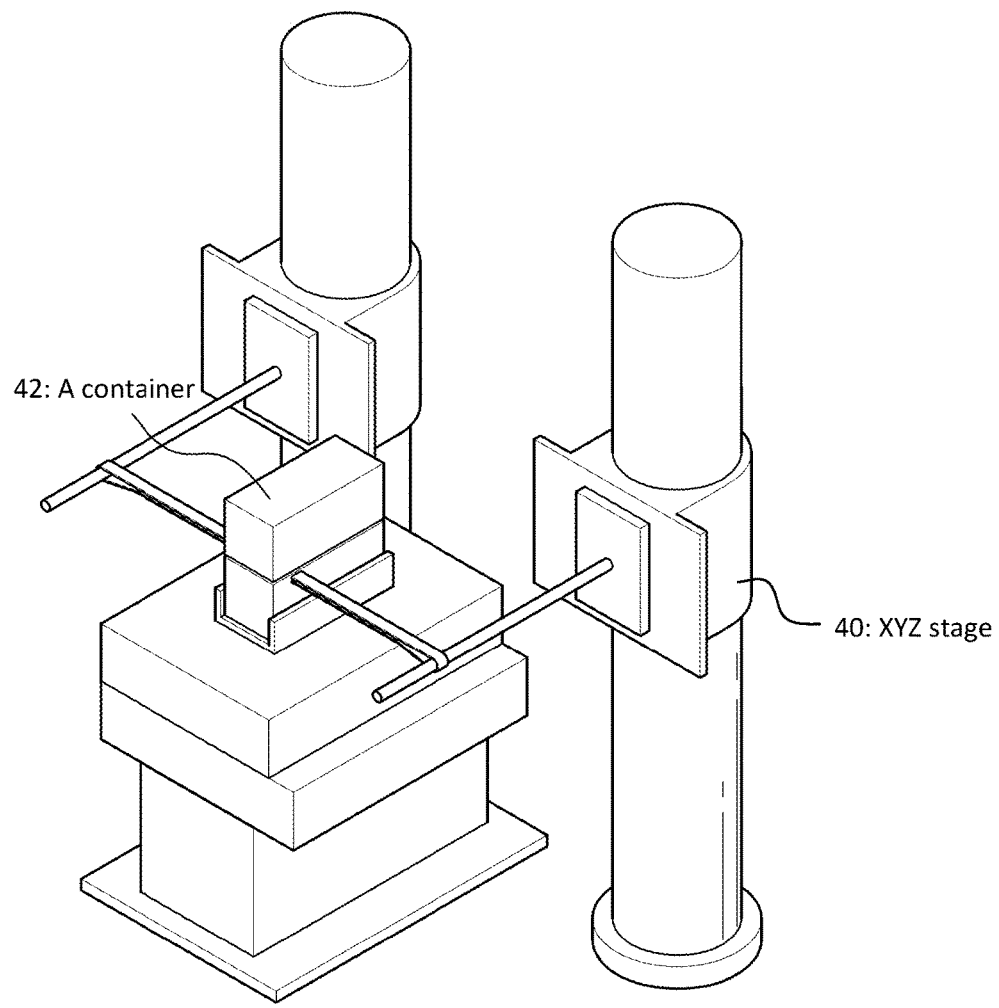
FIG. 3 is a configuration diagram of the driving unit shown in FIG. 1.

FIG. 3 is a detailed configuration diagram of the driving unit 200 with the sensing unit 100 shown in FIG. 2 mounted thereto.

As shown in FIG. 3, the driving unit 200 may include an XYZ stage 40. The XYZ stage 40 may include a container 42 to keep the sensing unit 100 therein. The container 42 may be formed in a type of a rectangular box in which the sensing unit 100 are disposed.

The XYZ stage 40 may move the sample 10 or the sensing unit 100 in accordance with predetermined velocities. The XYZ stage 40 may be automatically controlled by control signals from the data processing unit 300 to move the sample 10 or the sensing unit 100. Alternatively, the sample 10 or the sensing unit 100 may be moved by a manual operation.

The XYZ stage 40 employed in the embodiment has high resolution, for example, 0.01 mm/pulse.

Figure 4:
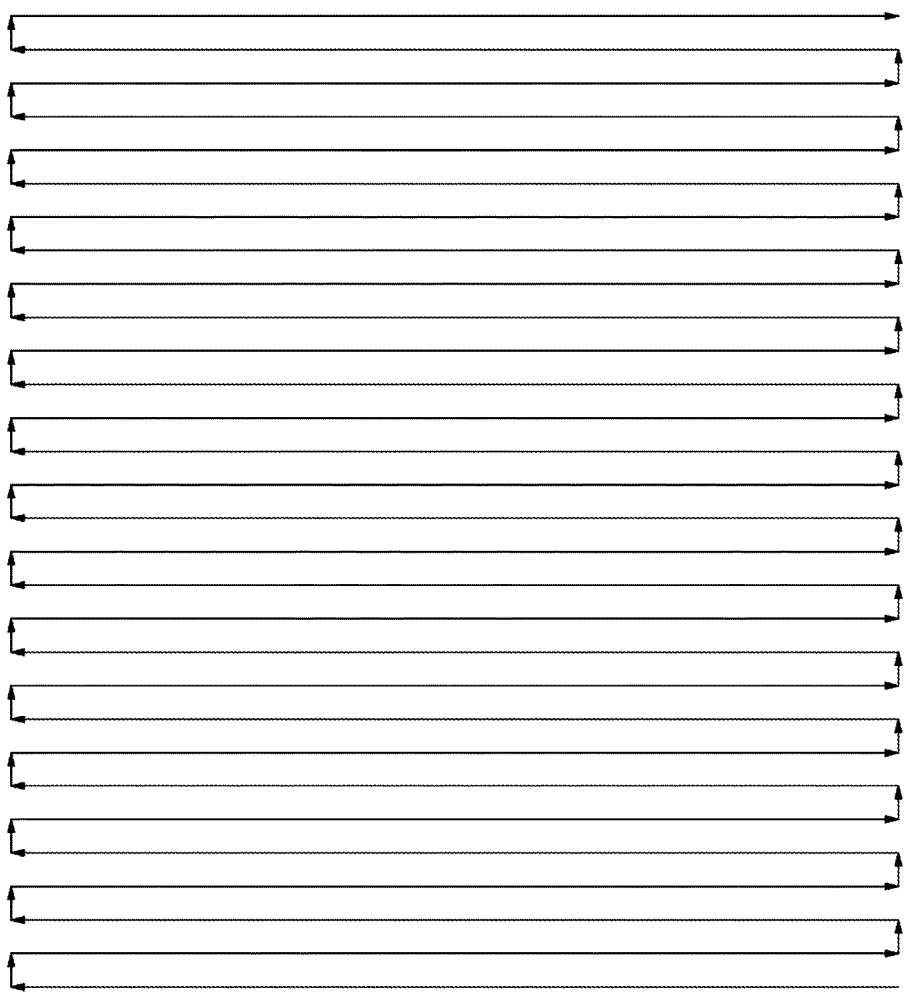
FIG. 4 is a view explaining a scanning path formed by the driving unit shown in FIG. 1.

In order for the sensing unit 100 to detect the sample signals that represent a mixed frequency component generated from both high and low frequency electromagnetic fields incident on the magnetic particles in the sample 10, the XYZ stage 40 may move the sample 10 or the sensing unit 100 along X-axis and Y-axis directions as illustrated in FIG. 4. Specifically, the driving unit 200 may be linearly operated in a way of moving the sample 10 or the sensing unit 100 in an alternate X direction and Y direction while moving it in a zigzag along the X-axis direction. Accordingly, the sample 10 or the sensing unit 100 may be moved from the lower right corner to the upper left of a square region with subsequent horizontal lines where stepping in Y-direction by a preset height.

For example, the XYZ stage 40 may be configured to move at a velocity of about 1.0 mm/sec to 4.0 mm/sec in the alternate X-axis and Y-axis directions after the motion onset of the data processing unit 300, for example, after 10 to 30 seconds.

Further, Z-axis data may be obtained in a way of measuring the change in the electromagnetic signals based on the distance between the first detection coil 106/1 and the second detection coil 106/2 and then transforming the measured Z-axis data into a function of the change in in the electromagnetic signals.

Therefore, a 3-D stereoscopic distribution image of magnetic particles of paramagnetic or super-paramagnetic material can be recognized by measuring X-, Y- and Z-axis data through the sensing unit 100 and securing 3-D distribution of the magnetic particles through the imaging unit 400.

Hereinabove, with the configuration of the embodiment, it is possible to inspect 3-D distribution of the magnetic particles of a paramagnetic or super-paramagnetic material by detecting linear X-, Y-axis, and Z-axis data and reconstructing the linearly detected signals.

As set forth above, the embodiment secures linear sample signals from particles of a paramagnetic or super-paramagnetic characteristic and reconstructs the linearly detected signals as 2-D or 3-D images by re-arranging them. Based on the foregoing process, a sample of nanomagnetic particles under developing as the image tracer is analyzed to recognize 3-D distribution of the particles.

Further, in accordance with the embodiment of the present invention, it is expected to develop 1) a technique to measure 2-D or 3-D distribution of magnetic particles of a paramagnetic or super-paramagnetic material characteristic through the use of mixed electromagnetic fields; 2) a technique to reconstruct distribution image based on the measured distribution data; 3) a technique to measure portions that causes disease (such as an antigen-antibody reaction) from a medical sample by modifying the surface of the magnetic particles; and 4) a technique to secure an image that is labeled in a tissue section for a biochemical analysis or disease diagnosis using the magnetic particles.

While the invention has been shown and described with respect to the embodiments, the present invention is not limited thereto. It will be understood by those skilled in the art that various changes and modifications may be made without departing from the scope of the invention as defined in the following claims.

What is claimed is:

1. An apparatus configured for magnetic particle imaging, the apparatus comprising:

a sensing unit configured to detect sample signals, which represent mixed electromagnetic fields, generated from magnetic particles in a sample;

a driving unit configured to move the sensing unit in a direction of X-axis, Y-axis, or Z-axis; and a data processing unit configured to rearrange, in a matrix, the sample signals detected by the sensing unit, wherein the sensing unit comprises:

a first coil set disposed at an upper part of the sample; and a second coil set disposed at a lower part of the sample, wherein each of the upper and lower coil sets comprises:

a first frequency coil connected to a first frequency AC power source and configured to pass a first frequency through the first frequency coil;

a second frequency coil connected to a second frequency AC power source and configured to pass a second frequency through the second frequency coil, the second frequency being higher than the first frequency, the first frequency being a non-zero frequency, wherein the second frequency coil is surrounded by the first frequency coil; and a detection coil surrounded by the first and second frequency coils and configured to detect a sample signal that represents a missed frequency component generated from first and second frequency electromagnetic fields incident on the magnetic particles in the sample, wherein the first and second frequency coils contribute to the generation of the sample signals.

2. The apparatus of claim 1, further comprising:

an imaging unit configured to convert the processed signals by the data processing unit into a 3-D magnetic particle image.

3. The apparatus of claim 1, wherein the detection coils are connected to the data processing unit.

4. The apparatus of claim 1, wherein the driving unit comprises an XYZ stage.

5. The apparatus of claim 4, wherein the driving unit is operated in a way of moving the XYZ stage in an alternate X direction and Y direction while moving in a zigzag along the X-axis direction, and wherein the data processing unit is configured to detect X-axis data and Y-axis data during the movement of the driving unit.

6. The apparatus of claim 1, wherein the data processing unit is further configured to detect Z-axis data by measuring the change of the electromagnetic fields between the first detection coil and the second detection coil.

7. The apparatus of claim 1, wherein the data processing unit is configured to amplify and re-arrange linear sample signals that are obtained linearly.

8. The apparatus of claim 1, wherein the magnetic particles comprise nanomagnetic particles.

9. The apparatus of claim 8, wherein the nanomagnetic particles comprise a paramagnetic material or a superparamagnetic material.

10. The apparatus of claim 8, wherein the nanomagnetic particles have a particle size of about 30 nm to 150 nm.

11. The apparatus of claim 8, wherein an undiluted solution of the nanomagnetic particles has a concentration of about 25 mg/ml.

12. The apparatus of claim 1, wherein the first and second frequency coils and the detection coil move together when the driving unit moves the sensing unit.

13. An apparatus configured for magnetic particle imaging, the apparatus comprising:

a sensing unit configured to detect sample signals, which represent mixed electromagnetic fields, generated from magnetic particles in a sample;

a driving unit configured to move the sensing unit in a direction of X-axis, Y-axis, or Z-axis; and a data processing unit configured to rearrange, in a matrix, the sample signals detected by the sensing unit, wherein the sensing unit comprises first and second coil sets that are disposed on opposite sides with the sample between them, each of the first and second coil sets comprising:

a first frequency coil connected to a first frequency AC power source, and configured to pass a first frequency through the first frequency coil;

a second frequency coil connected to a second frequency AC power source, and configured to pass a second frequency through the second frequency coil; and a detection coil surrounded by the first and second frequency coils to detect a sample signal that represents a mixed frequency component generated from first and second frequency electromagnetic fields incident on the magnetic particles in the sample, wherein the detection coil is connected to the data processing unit.

14. The apparatus of claim 13, wherein the first and second coil sets are disposed at upper and lower parts of the sensing unit, respectively.

* * * * *